(12) United States Patent
Swan et al.

(10) Patent No.: US 6,243,635 B1
(45) Date of Patent: Jun. 5, 2001

(54) INTEGRATED SEAT CONTROL WITH ADAPTIVE CAPABILITIES

(75) Inventors: Jeffery Swan, Hersey; Randy Perrin, Cadillac; Todd Newman, Reed City; John Washeleski, Cadillac, all of MI (US)

(73) Assignee: Nartron Corporation, Reed City, MI (US)

( * ) Notice: Subject to any disclaimer, the term of this patent is extended or adjusted under 35 U.S.C. 154(b) by 0 days.

(21) Appl. No.: 09/141,277

(22) Filed: Aug. 27, 1998

Related U.S. Application Data

(63) Continuation-in-part of application No. 08/936,479, filed on Sep. 18, 1997, now Pat. No. 6,049,748, which is a continuation-in-part of application No. 08/918,918, filed on Aug. 27, 1997, now Pat. No. 5,982,253.

(51) Int. Cl.[7] .................................................. G05B 23/00
(52) U.S. Cl. ............................... 701/49; 701/36; 296/63; 296/64; 296/65.01; 297/105; 318/3; 307/9.1
(58) Field of Search .................................. 701/49, 36, 37; 307/9.1; 318/3, 700; 248/550; 297/105, 216.1, 217.3, 464; 296/63, 64, 65.01

(56) References Cited

U.S. PATENT DOCUMENTS

| 4,845,620 | * | 7/1989 | Parker ................................... 701/49 |
| 5,334,876 | | 8/1994 | Washeleski et al. . |
| 5,497,326 | | 3/1996 | Berland et al. . |
| 5,652,704 | * | 7/1997 | Catanzarite ............................ 701/49 |

OTHER PUBLICATIONS

JOHN WASHELESKI, Statement of Prior Art, Jan. 14, 1999, 1 page, Reed City, Michigan.*

* cited by examiner

Primary Examiner—William A. Cuchlinski, Jr.
Assistant Examiner—Yonel Beaulieu
(74) Attorney, Agent, or Firm—Brooks & Kushman P.C.

(57) ABSTRACT

A motor control system employed in a mechanism including displacers driven by motors, for example, a vehicle seat control system, includes motor operation parameter detection or simulation as inputs to adaptive algorithms to simplify the control system. The adaptive algorithms compensate for the interference with detection of generated or sensed pulses in previous pulse counting implementations. The seat control permits additional functions to be performed without numerous sensors, power controls and robust demands required in previous systems for controlling motors.

36 Claims, 11 Drawing Sheets

FIG 3
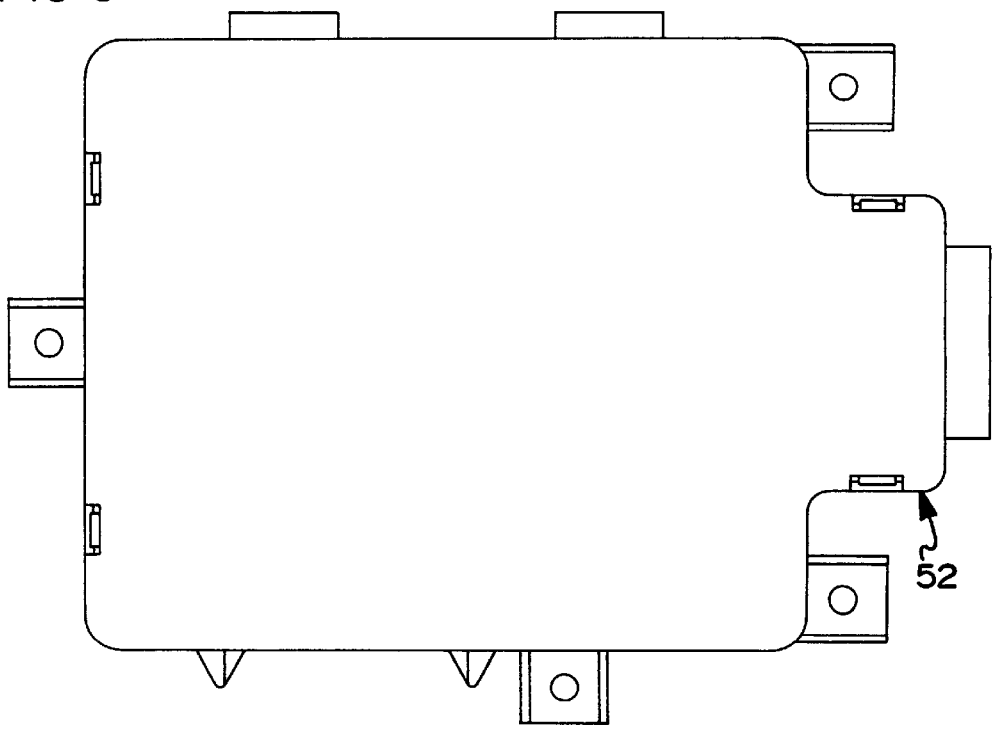
FIG 4
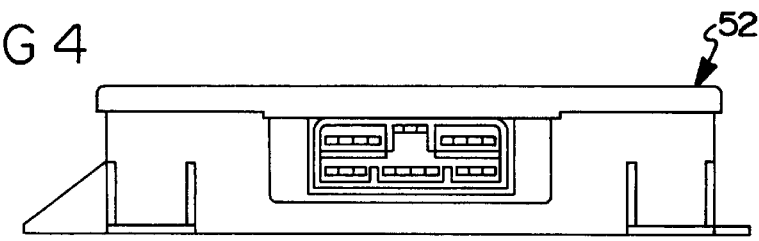
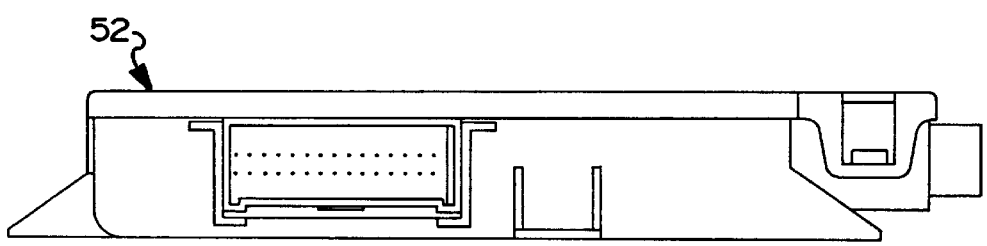
FIG 5

INTEGRATED SEAT CONTROL WITH ADAPTIVE CAPABILITIES

CROSS-REFERENCE TO RELATED APPLICATION

This application is a continuation-in-part of an application Ser. No. 08/936,479 filed Sep. 18, 1997 now U.S. Pat. No. 6,049,748, entitled Massage Controller Module (MCM), which is a continuation-in-part of an application Ser. No. 08/918,918, entitled "In-Line Module For Attenuating Electrical Noise", filed in the U.S. Patent and Trademark Office on Aug. 27, 1997 now U.S. Pat. No. 5,982,253, and commonly owned.

TECHNICAL FIELD

This invention relates to vehicle seat control systems with advanced control, diagnostics, and functional features in the seat control system including motors and motor responsive sensors.

BACKGROUND ART

Increasing numbers of vehicles have an electrical motor driven, mechanical or pneumatic, multiple support adjustment seats with a controller system offering optional upscale features. Vehicle is herein construed as including car, truck, rail train, airplane, and the like. The features may include multiple displacements of several seat portions and incorporation of a seat lumbar support. In addition, a position sensor and a memory module for closed loop feedback positioning of various supports in the seat relative to the user seat position is selected by the user or automatically set by controller module memory settings. For example, this allows a person, identified as and with a controller # one, to various seat adjustment positions to an individual preference, and then set memory # one for these settings. When the recall position # one switch actuator is manipulated, for example, a recall button is pressed, the seat will return to the multiple adjusted preference settings set by driver # one.

Likewise, person # two may set memory # two and recall position # two, if the system is designed for additional personal settings. The basic seat lumbar adjustment control offers no lumbar position sensor. The optional system upgrade version typically includes a modular controller having the seat position memory feature which necessarily includes a seat position sensor system.

However, these previously known seating systems require sensor systems for precise displacement and positioning of the seat portions, and each movement may require its own set of input switches, limit switches, sensors or the like, as well as power supply for the sensors and the sensor responsive equipment. Such components can add a substantial amount of hardware, complexity and cost to the system and increase the size of the system and the time and the cost of production.

Although some previously known motor control systems have recognized that commutator pulses may be used to gauge motor rotation speed, such systems have not been readily applicable to seat assemblies. Motor brush or other dust may interfere with the detection of pulses, and may create false pulses. In addition, in-rush current at motor start-up and initial movement may interfere with detection of pulses that should have occurred. As a result, previously known pulse counting applications did not accurately gauge positioning of the components moved by a motor, or permit repeatability of positioning, for example in a seat mechanism, involving starting and stopping over time. As a result, separate sensor systems have been relied upon to control positioning.

Stepper motor controllers have been utilized by the machine industry for some time. An example would be indexing to position to place a part or remove a part. In addition, there is usually a feedback sensor as a redundant to verify the accuracy. However, these systems are far too expensive for adaptation to automotive implementation such as seating control features.

As a result, traditional seat control systems have grown in size, weight, complexity and cost due to increasing consumer demand for new features.

SUMMARY OF THE INVENTION

The present invention overcomes the above-mentioned disadvantages by utilizing motor operation parameter detection or its simulation with adaptive algorithms to simplify a control system. The adaptive algorithms compensate for the interference with detection of pulses in previous pulse counting implementations and avoid error accumulation in the maintenance or adjustment of the position of a displacer. Preferably, the control system, for example, a modular system of seat control features, may be functionally improved without adding a wide variety of hardware and controls that was previously implemented for each new feature for vehicle seating system applications. As described in this application, the term motors is to be understood as generally referring to motion generators creating forces that can act upon displacers, regardless of whether the force generator is a rotary shaft motor or a linear actuator.

The preferred configuration uses commutator pulses and monitors the time between pulses for speed as well as position. Each time the motor brushes move past a commutator segment, the position can be determined and stored by the control based on the gear drive ratio of motor movement to linear movement. As a result, the displaced item's position is more accurately determined than with previous position sensors. The use of commutator pulses can be difficult because detection may be interfered with by missing commutator pulses, during startup, during shut down or due to noise conditions. As a result, a control according to the present invention includes compensation, for example, an algorithm within the microcontroller that identifies these conditions and makes the proper adjustments to the position record in the microcontroller memory, therefore maintaining high accuracy for the brush motor type systems. Moreover, the system reduces wire gauge requirements, for example, for power delivery to the motor and reduces requirements for signal communications.

The compensation may also be accomplished using a brush motor with an external sensor, such as a Hall effect or encoder that will provide pulses, as the motor assembly moves. However, although the external sensor provides the same type of information as the commutator pulses, such a sensor requires additional components.

Another embodiment for such compensation would be a stepper motor control, which is a brushless motor control. These brushless motors come in two forms, sensor feedback and sensorless. The brushless motor is different as it requires a control to provide a signal to one or more of multiple windings, which then instructs the motor to make a movement; i.e., the control will move the motor in increments based on controlling the energization of each of the windings. However, one disadvantage is some method needs to validate that the movement did occur since a control pulse or direction sent to the motor does not guaranty that the motor has turned. In the brush type motors, sensing the commutator pulse is a response that indicates the motor has moved. By using one of the windings not energized in the brushless motor, a pseudo commutator pulse will be generated by the magnetic field, which then will tell the control that the motor has turned.

An additional reduction of components and their corresponding space and weight may be achieved by utilizing a brush or brushless concept as outlined above, as well as integrating the electronics and motor in conjunction with a gear box. Preferably, the gear box eliminates the many motors previously required, and substitutes associated mechanical, electrical, electronic or pneumatic couplings selectively engageable with a single motor that can be used to position each of the individual features. By substituting the gear box for each individual motor, the system current draw is reduced, the number of motors is reduced to one, and wiring complexity and component packaging are reduced.

Complementary in-line modules incorporating monitoring and control algorithms cooperate with signal and power control as in previous application Ser. No. 08/936,479, entitled MASSAGE CONTROLLER MODULE (MCM) and incorporated herein by reference. As a result, desirable features such as massage control can be easily incorporated and provide numerous advantages to an existing seat control system by encouraging blood circulation, stretching and relaxing muscles, varying strain on skeletal members, varying strain on cartilage between articulating skeletal members and also producing a relaxed feeling without substantial changes to the system or its controls.

An in-line module interfaces and integrates with existing and future automotive seat control hardware and software, as pertinent, to provide complementary functions. A controller module may be relatively small compared to discrete component control systems and size which requires only minimal or no wiring change to the existing seat control circuitry, yet appears to be virtually nonexistent to and allows full priority to all functionality of the existing seat controls and actuators.

The existing seat controller module can be supplemented or replaced with an alternative control module offering current control features plus increased functionality upgrades. It should be understood that for seat control systems having memory set and recall features, the existing electronic seat controller module either can be complemented by addition of the module to the system, or alternatively, can be replaced by another version of the controller which incorporates all functionality into one single unit. In seat control systems having no memory set and recall features, a simple seat control system having no electronic seat controller module will be referred to as a seat control, and as such the module will preferably be a complementary addition to the system.

In addition, the motor controller system of the present invention may be employed in substantially different displacement mechanisms powered by a motor, regardless of whether the implementation is automotive related. Nevertheless, another example of automotive applications related to occupant support is that operator responsive actuators may be displaced according to the present invention to improve ergonomics without complications the hardware and production requirements, and the associated costs, traditionally associated with such improvements in vehicles.

BRIEF DESCRIPTION OF THE DRAWINGS

The present invention will be more clearly understood by reference to the following detailed description of a preferred embodiment when read in conjunction with the accompanying drawing in which like reference characters refer to like parts throughout the views and in which:

FIG. 3 is a top view of the preferred module housing;

FIG. 4 is a front edge view of the preferred module housing;

FIG. 5 is a side edge view of the preferred module housing;

DETAILED DESCRIPTION OF PREFERRED EMBODIMENT

Figure 1:
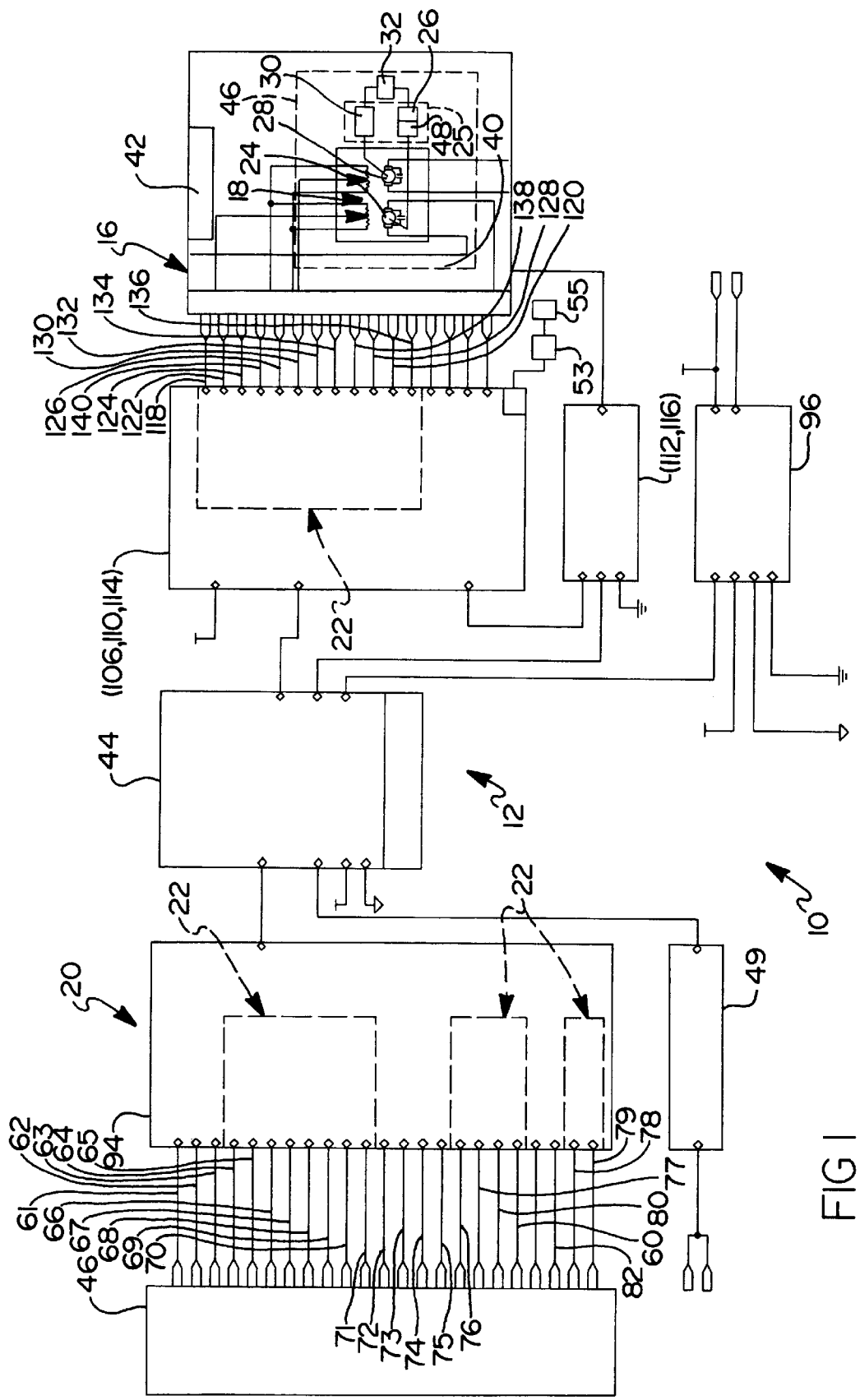
FIG. 1 is a diagrammatic, partly schematic view of a vehicle seat control system with position memory and implementing a motor position responsive control module with adaptive pulse compensation according to the present invention.

Referring first to FIG. 1, a seat control apparatus 10 includes improvements in the method and structure for providing advanced seat control functions with automatic feedback control systems. These methods and structures for automatic control are applicable to other diverse smart control systems unrelated to automotive seating, but are well adapted to seat controls including seat heating, multiple seat cushion positioning, multiple-axis seat positioning, and the like described in detail in this application. However, the invention is not so limited. Fast acting real time microprocessor algorithms with memory storage means and appropriate interface circuitry choices contribute to improved control system response detection means for various modes of fault conditions including obstacle or obstructed movement detection, electrical shorts, electrical open circuits, and abnormal inputs.

The preferred embodiment illustrated demonstrates significant applicability and cost effectiveness for various types of motion control systems, regardless of whether they are related to automotive seating systems. Advantages and benefits are due in part to the sensing of motor actuation electrical current signals and commutation pulses with interface circuitry, the microprocessor algorithms used, and the counters alone and in combination with each other as to determine both device position, motion and loading. Electronic circuit means and methods for reading and using motor commutation pulses, motor current signals, clock pulses, microcontroller counting registers, and digital processing algorithm routines of the microcontroller dynamically determine and adaptively respond to device movement characteristics. Accordingly, while not limited to automotive seat systems, substantial econometric value can be realized from the invention as shown.

Referring to FIGS. 1 and 2, a motor vehicle seat control system 10 is thereshown employing a control mechanism 12 (FIG. 1) for driving a seat mechanism 16. In either event, the seat mechanism 16 includes motors 18 for driving portions of the seat with respect to other portions of the seat or with respect to the support for the seat. In the preferred embodiment, a first version 20 (FIG. 1) of the vehicle seat system 10 includes a memory set and recall system for repositioning all movable features of the seat to a predetermined position selected by an occupant. The features of a non-memory version employs simpler controls, as indicated at blocks 22, for adjusting seat positions such as seat height, back inclination, forward and reverse positioning, and tilting of the seat base. Moreover, it will be understood that the present invention can also be implemented with a wide variety of seat systems regardless of the particular vendor or the models provided by the vendor to provide improved operations such as a massage function without interfering with seat control, seat mechanism, or electrical connections of the seat controls. In addition, additional controls may be provided by the controller for one or more drive motors 53 coupled to drive displacement apparatus 55, for example, brake or throttle pedal positioners, or steering wheel positioners, external to the seat mechanism 16. Moreover, substantially any motor driven system can be improved by incorporating the control method and apparatus of the present invention.

In the preferred embodiment, a seat displacement mechanism 16 includes a displacer, for example, a lumbar support 32 as disclosed in U.S. application Ser. No. 08/936,479 incorporated herein by reference, driven by a first motor 24, that controls a movement mechanism 26 for displacement of the lumbar support 32 upwardly and downwardly through the seat back. A second motor 28 controls a lumbar support extender 30 and it governs the degree to which the lumbar support extends outwardly from the seat back toward a spinal curvature of an occupant. Both mechanisms 26 and 30 affect the position of the lumbar support 32 of the seat mechanism 16.

Referring to FIGS. 3–5, the massage control module 34 is relatively small so as to be able to be mounted under the drivers' or front passengers' seat and can integrate and interface with existing hardware and wiring harnesses, as applicable, to provide lumbar massage and other functions. In some cases, it may be practical to modify or redesign the wiring harness to facilitate integration of the massage control module into the system.

In the case of a non-memory type seat control system 22 which offers no existing optional lumbar support position sensor 40, the lumbar support position can alternatively be analytically derived in various ways such as an absolute encoder on the motor where added expense can be accommodated. A resolver on the motor or a simple incremental encoder on the lunbar support drive motor may be used in less expensive embodiments. With resolvers and encoders, appropriate algorithms such as these taught in the present application and motor stall current detection can be used to determine lumbar position, preferably within a tolerance of one motor revolution where tens, hundreds or orders more of revolutions are required between end of travel (EOT) limits.

Various module control modes such as manual, automatic, sleep (power save), and teach are preferred for incorporation with many systems. Manual mode allows full manual control to override and possibly discontinue automatic functionality. Automatic mode allows automatic powered control of the system outputs. Sleep mode, also known as power save mode, is favored for battery powered applications wherein battery charge is to be conserved. Sleep mode is typically entered automatically after an I/O activity timer times out indicating no controller I/O activity has occurred for some amount of time. When in sleep mode, the control module goes into a very low quiescent current drain operation, awaiting some input signal to reset the timer effecting a "wake up" thereby causing it to return to full power operational mode. Teach mode is an option whereby a portion of the functionality of the system control is taught or programmed by a user.

Utilizing DC motor current commutation pulses sensed by the described interface means provides a simpler and lower cost means to detect motor rotation and therefore seat cushion position than by previously disclosed means of an analog output external absolute position encoder sensors. By this means of motor pulse counting with appropriate microcontroller counter circuits, the present invention enables additional functions to be performed cost effectively and with reduced lead time for implementation or production vehicles. Moreover, it becomes possible to add memory positioning and massage functions to seat control systems without the previous necessity of having available or adding seat cushion position feedback sensors. Position counters can be reset with the increase in motor current and/or with the increase in time between commutation pulses that indicates that the motor is approaching an end of travel stalling condition. Input (EOT) reset description. The control can adaptively learn the number of counts from one stall limit to the opposite stall limit such that it can predictively turn off shortly before both stall limits. Such a current control reduces peak load torques, improving fatigue life, reducing the potential for unwanted noises otherwise produced by application of full power into a physical stop, and substantially reduces wire gauge necessary to operate the motor.

Figure 9:
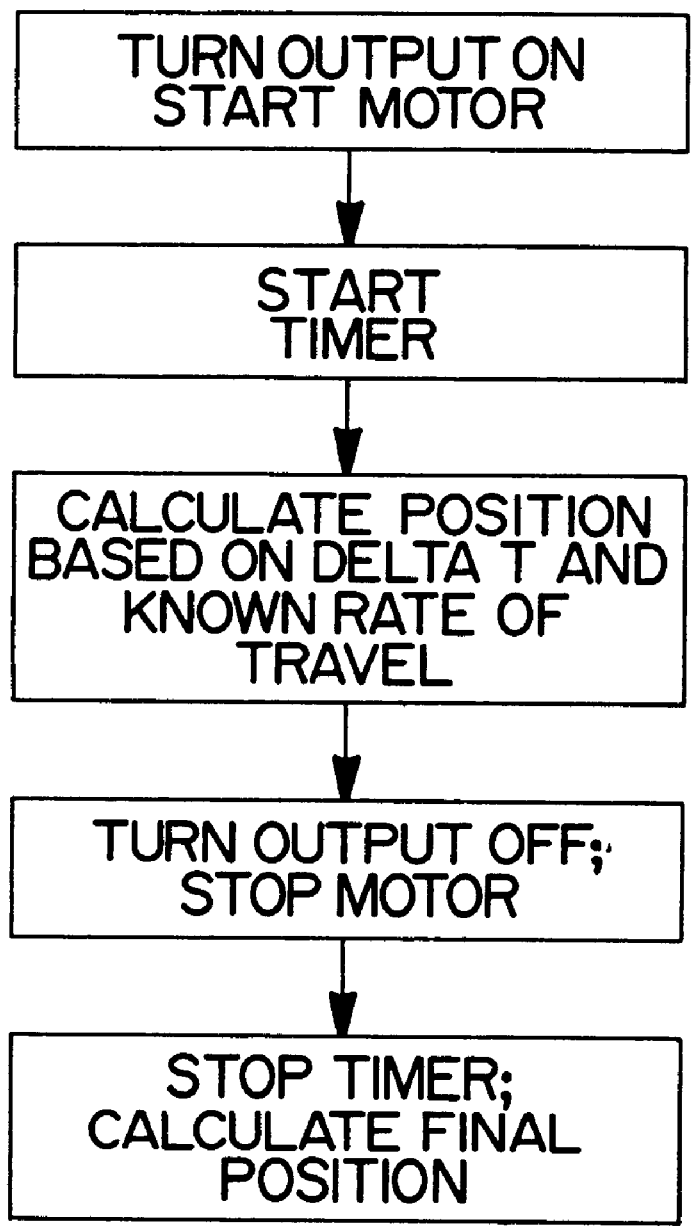
FIG. 9 is a block diagram similar to a portion of FIG. 6 but showing a modified control algorithm portion incorporated in the present invention.
Figure 10:
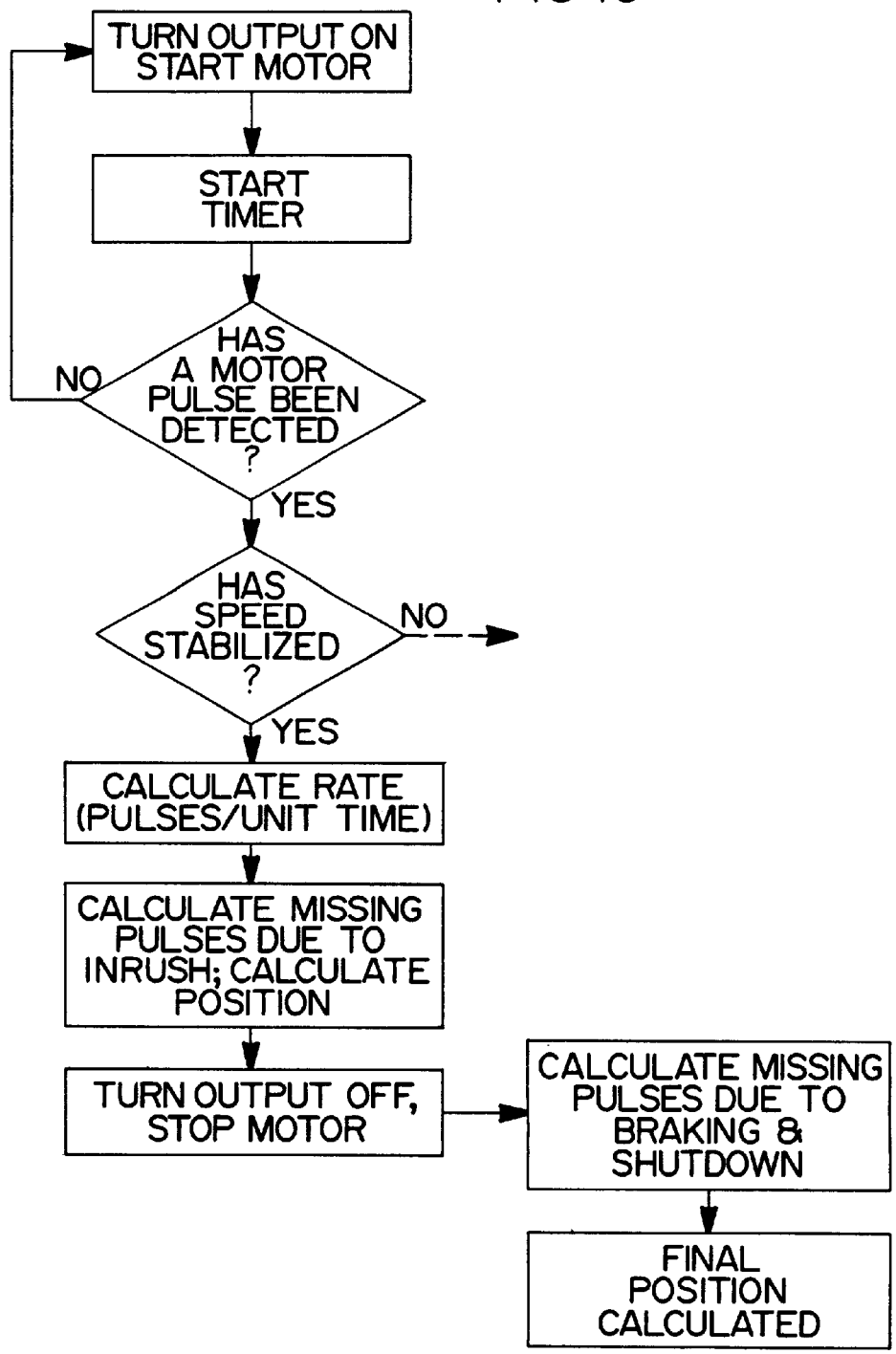
FIG. 10 is a block diagram similar to FIG. 9 but showing an alternative control algorithm incorporated in the present invention.

Moreover, the end of travel (EOT) limit detection can also be employed to reset calculated position or to zero-in counters so that less accurate sensor algorithms or simulations initially relied upon to represent position, do not accumulate and introduce location error throughout the life of the system. An example of a control system determining position with a less precise determination of displacement than in the preferred embodiment is shown in FIG. 9. The position is simulated by estimating the motor movement as a function of time and the previously known or estimated rate of displacement. Another example is shown in FIG. 10 where position detection is simulated by counting pulses and calculating or estimating the missing pulses once speed and pulse counting has stabilized.

Addition of the seat position set, recall, massage, and massage teaching functions can be easily implemented via the existing up and down switches, because the controller can respond to inputs by such means as application of simultaneous switch activation (for example up and down switches at the same time, timed activation (the length of time for which a switch actuation is maintained), and/or activation sequence (for example one quick up then one quick down or one quick down then one quick up). As with previous applications, an in line electrical filter module will be a preferred option with the drive motors.

An alternative embodiment uses a distributed control scheme based on a master/slave concept fully described here later. In this embodiment, SMART MOTOR endcaps integrate the control system having integrated microcontrollers within the motor housing to perform certain local functions, reducing the need for higher pin count master microcontrollers and extra external circuitry in the adaptive seat module. However, the invention as described here can also be implemented as either a set of discrete components, circuits or submodules, or implemented as a single custom integrated circuit or set of custom integrated circuits, or implemented as some combination of custom integrated circuits and commercial components.

Figure 2A:
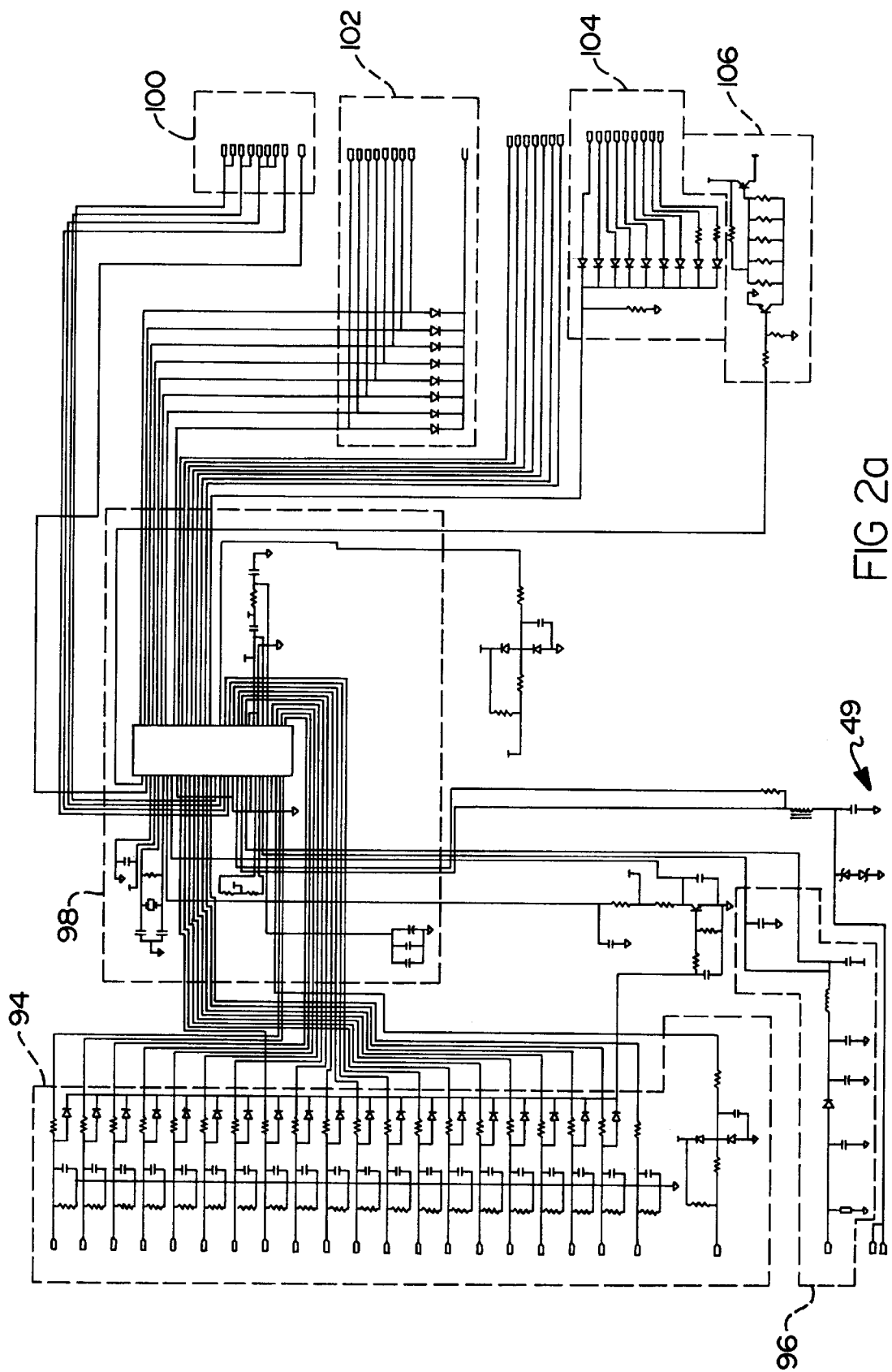
FIG. 2a is a schematic view of portions of the system shown in FIG. 1.
Figure 2B:
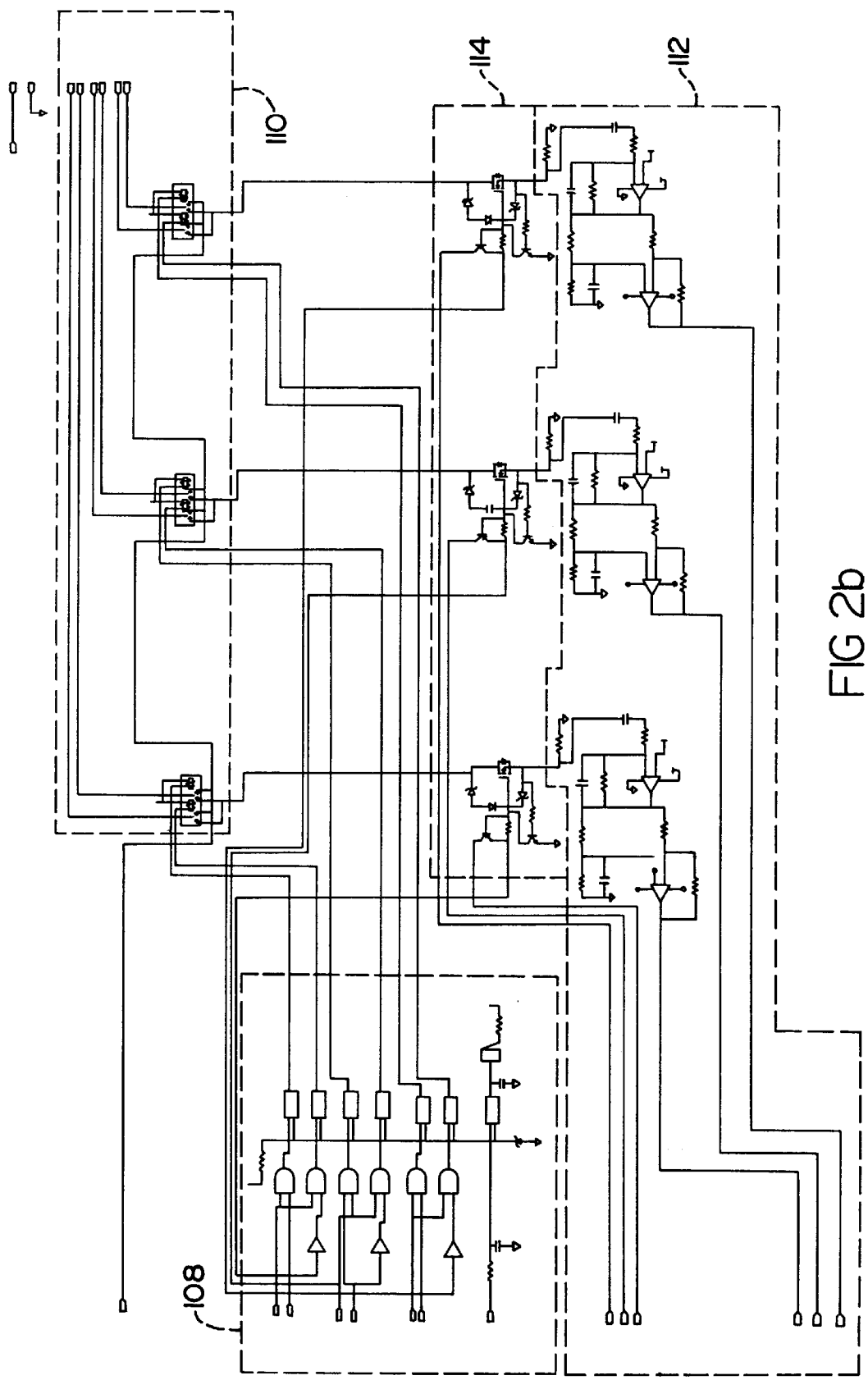
FIG. 2b is a schematic view of other portions of the system shown in FIG. 1.

Inputs are represented in FIG. 2a by block 94 that incorporates input protection and filtering. Analog motor current can be sensed to correlate with motor loading conditions. Incremental motor movement can be sensed by the conversion of the characteristic alternating component of motor current commutation pulses into digital form for position encoder counting, the count which represents actuator position. FIG. 2a schematic block 104 incorporates inputs for motor commutator pulses. FIGS. 2b, c, d schematic block 122 incorporates the active filters for sensing motor current commutation pulses. The component values are adjusted by software adaptation in the controller or hardware component selection to work with each motor based upon its anticipated current range and commutation pulse amplitude. For example, all sensing shunts such as the resistors shown in FIGS. 2b, c, d block 112 could be replaced with a wirewound resistor, wirewound coil, simple inductor or solid state device. In addition, software filters can be employed in the controller 12.

Figure 2C:
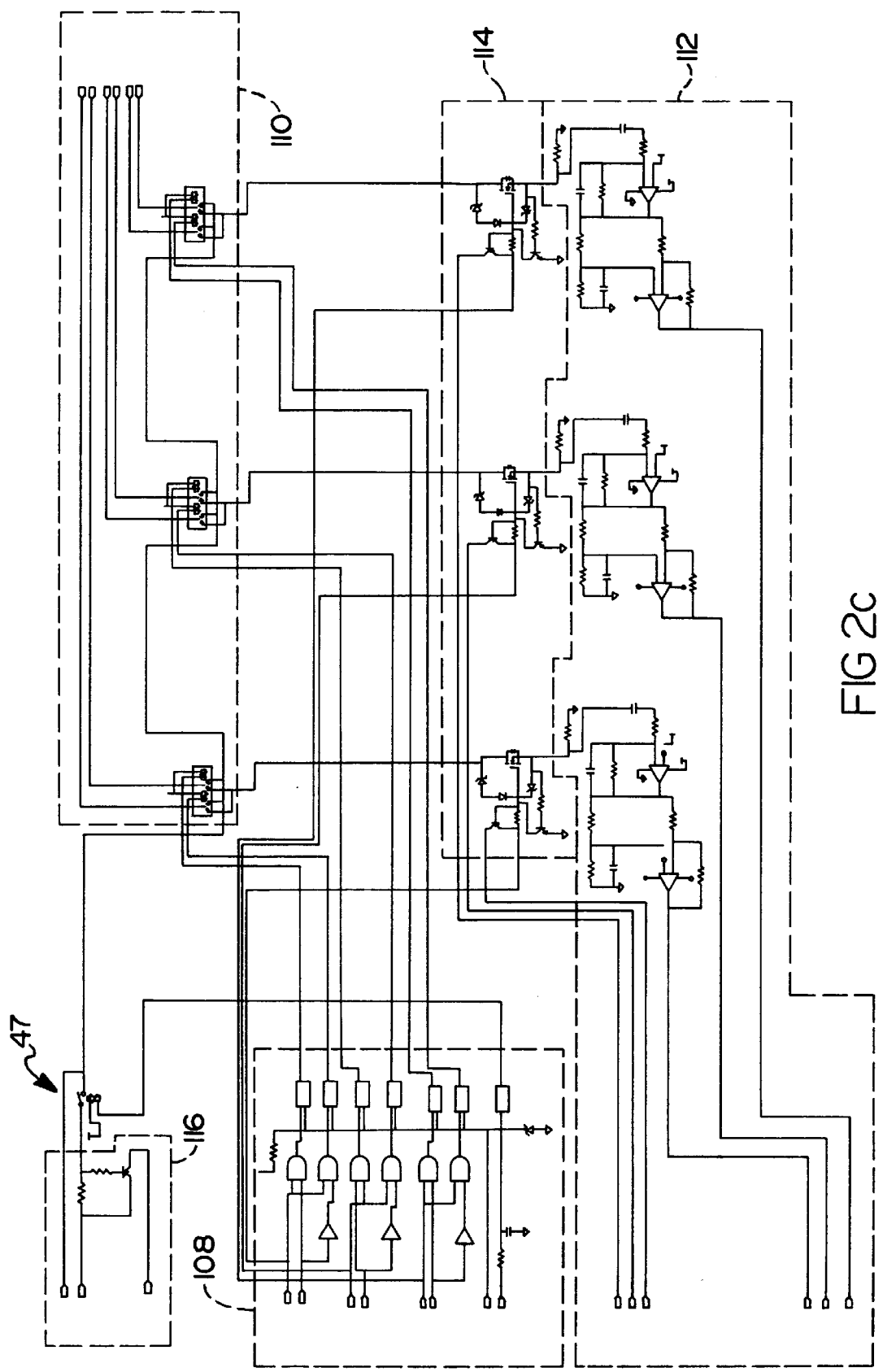
FIG. 2c is a schematic view similar to FIG. 2b but showing a modified embodiment of a power supply (L) without a power limiter to the load for a control according to the present invention.
Figure 2D:
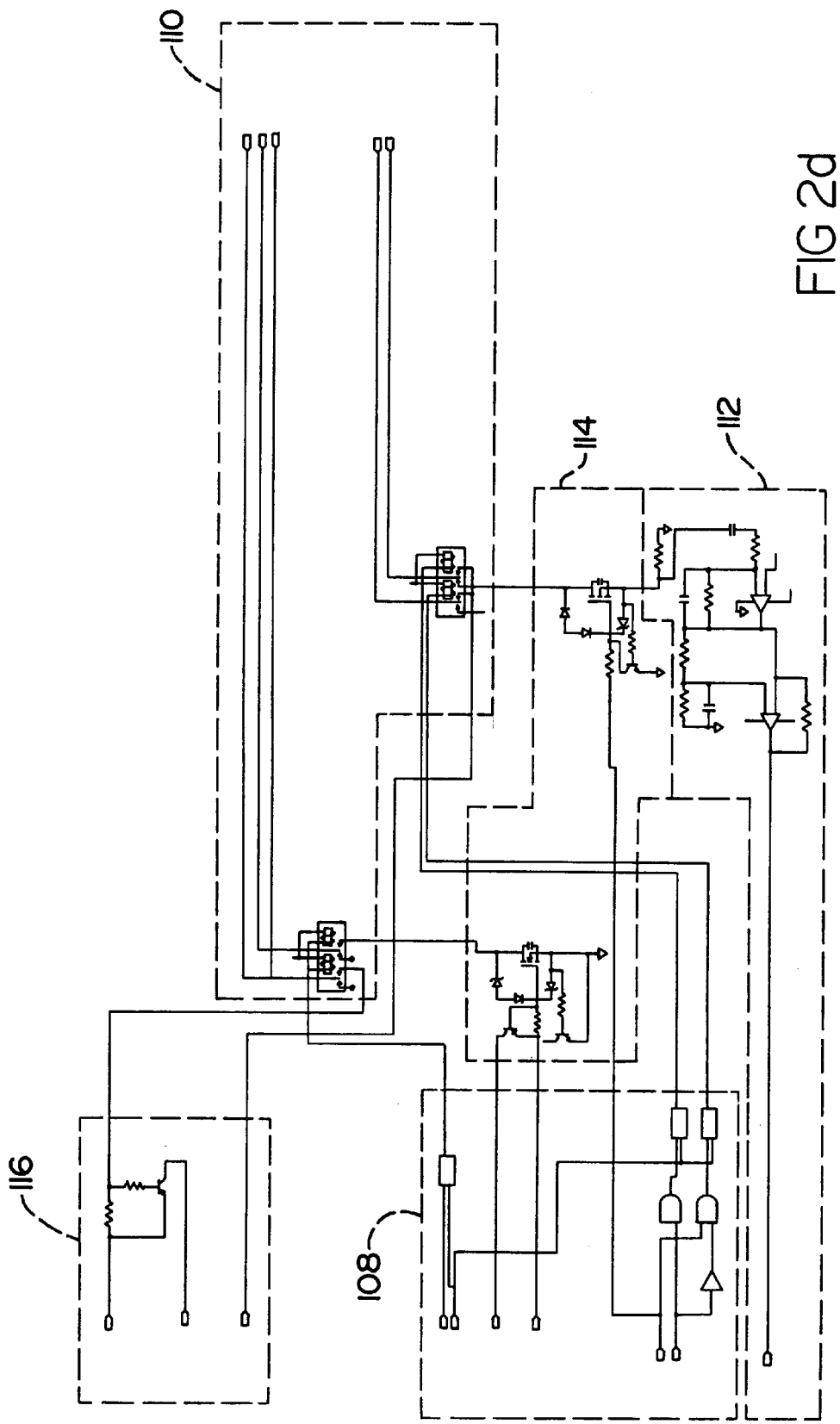
FIG. 2d is a schematic view similar to FIGS. 2b and 2c but showing a modification to the output logic decoders and drivers in a manner that expands I/O port capacity for an improved control according to the present invention.

Controller output is shown in FIGS. 2b, 2c, and 2d. Motor driver decode logic is shown in FIGS. 2b, c, d block 108. Of course, other ways to expand the I/O port pins of the microprocessor are also available and may be included in the present invention, and multiple or integrated processors may be employed as desired.

Motor drivers are shown in FIGS. 2b, c, d block 114. Motor speed output drive (Block K, FIGS. 2b,c) can be controlled via typical drive methods such as pulse width modulation (PWM), analog output, and phase control. Relay control of motor drive is shown in FIG. 2b, c block 110. Redundant means for isolating the motor drives is achieved by the relay 47 coupling the power supply circuit in block 116 of FIGS. 2c, d to the relay drivers 110.

As shown in FIG. 2a at block 98, the controller and memory interaction is disclosed. Closed loop motion feedback control of speed and/or direction are economically performed using motor incremental position feedback signals derived from motor current commutation pulses. At block 112 in FIGS. 2b, c, d, the motor load current signal is AC coupled, amplified, band pass filtered, and compared to a reference DC signal, thus producing a digitized encoder signal used as one of the inputs to microcontroller counter routines to digitally count up and down to represent output device mechanical position. Resetting of the counter can be accomplished in response to switch input, end of travel stall current detection, excessive time of actuation in either direction, and/or by sensing reversal of direction via an analog position sensor.

An alternative to the circuit 112 for actuator position input is by use of an incremental or absolute analog encoder, for example, by a film resistor on a crank gear coupling a motor shaft to a displacer, coupled, for example, to a lumbar support 32. Another alternative for displacer position input is by use of an incremental or absolute digital encoder, for example by conductor patterns on an insulating substrate over a crank gear in a displacement mechanism as substitute for commutator pulses.

In the controller 12, motor speed is determined by time, for example, the number of clock pulses between motor commutator pulses. Preferably, motor acceleration is determined by the change in the number of clock pulses between at least two successive commutator pulse increments. Motor jerk is preferably determined by the change in the acceleration between at least two successive commutator pulse increments. Higher order derivatives of position are possible, but typically not utilized because of increasing sensitivity to noise with higher orders of algebraic differentiation.

Block 96 providing a power supply to microprocessor and block 106 providing a power supply to relays allowing connection of the motors (system) in FIG. 2a comprise the system power supply elements. Alternative constructions are also within the scope of the present invention.

Block 112 in FIGS. 2b, 2c and 2d comprises the circuits which sense the motor commutator pulses, provide filtering and deliver the pulses to the microcontroller 44. The motor load current signal is AC coupled, amplified, band pass filtered, and compared to a reference DC signal, thus producing a digitized encoder signal used by microcontroller counter routines to count up and down to represent output device mechanical position.

FIG. 2a block 94 shows protection means for the controls, such as the switches, employed to actuate the displacers in the seat mechanism 16. The inputs include the heated seat temperature sensor input 60, and switches such as memory 2 recall switch 61, memory 1 recall switch 62, memory set switch 63, recline back switch 64, recline forward switch 65, horizontal forward switch 66, horizontal back switch 67, front vertical up switch 68, front vertical down switch 69, rear vertical up switch 70, rear vertical down switch 71, lumbar up switch 72, lumbar down switch 73, lumbar in switch 74, lumber out switch 75, heated seat high switch 76 75, heated seat low switch 77, head rest up switch 78, head rest down switch 79, heated seat indicator 80, seat sensor input 60, ignition 1 signal input 81, and park signal 82.

FIG. 2a blocks 100 and 102 show control communications interface (I/O) for the microprocessor. Module system monitoring and diagnostics communication capability is a useful feature which can significantly simplify system maintenance by providing history of operational information and/or fault codes. Utilization of microcontroller control algorithms and routines incorporating watchdog capability, to trap and recover from software addressing problems, is incorporated to the microcontroller algorithms for reliable operation. The watchdog routine also works in cooperation with fault and system monitoring and diagnostics routines which can store and communicate abnormal operation states, fault conditions, or operational conditions which are or might potentially be or cause an operation error or damage.

Operation fault detection monitoring can be employed for use and equipment protection. Fault detection includes such types of faults as short circuit, open circuit, abnormal conditions, hard/soft obstacle detection, stall protection, over voltage, under voltage over temperature, under temperature, over speed, and under speed. Information from types of fault condition detection monitoring can be included in diagnostics communication capability for reasons such as functional operation verification.

Communication to and/or from the module can be achieved by such energy transmission modes as electrical conduction, E-field, M-field, EM-field, sonic, ultrasonic, vibration, pneumatic, hydraulic, thermal, and the like. Depending on the type of communication used, remote control and communication can be via a wireless method such as radio transmission, infrared transmission, and sonic transmission. The system is adaptable with various communication modes including standard as well as custom hardware and software protocols such as serial bus, parallel bus, multiplexing (MUX), demultiplexing (DEMUX), wave division MUX, infrared data exchange, for example, per IRDA, pulse width modulation (PWM), pulse position modulation (PPM), amplitude modulation (AM), frequency modulation (FM), frequency shift modulation (FSM), and the like. For example, in USA automotive systems, a class 2 interface with a favored communication standard is SAE J1850 as shown at 49 in FIGS. 1 and 2. Suffice it to say that single direction or bidirectional communication enables remote control of parameters, functions, timing, inputs, outputs, algorithm and routine programming, and even interactive encryption. By these means it is possible to add a control module remotely, near the controlled output, near the power supply or even in a convenient hidden location and thereby communicate control signals.

The microcontroller includes inputs, outputs and software algorithms within programmed memory for calculating the compensation provided as a result of response to actual or the simulation of a response to actual conditions that adjusts the control output for position of the relevant displacer. The microcontroller includes software for accepting user entered inputs via switches. Preferably, the software has known software filters to selectively filter out noise and switch contact bounce so that the control algorithm will only act upon valid input stimulus.

The software in microprocessor 44 controls external output circuitry that drives an electrical load, typically an electric motor 18. The output drive circuitry in K 114 and I 110 may be electromechanical in nature, a relay, or solid state. In the case of a motor load where an external current shunt is in use, the external drive circuitry can provide commutation pulse information and load current information to the microcontroller for the software to act upon. The commutation pulses of the motor can be filtered external to the microcontroller using known passive or active filter techniques as shown in FIGS. 2b, c, d at block 112. Alternatively, the microcontroller sof ware could include a digital filter to accomplish the same degree of filtering and replace the external circuitry.

In addition, compensation for commutation pulse discrepancies can be provided by a digital filter. For example, such a filter could include a missing pulse detection algorithm. When commutator pulses are counted, the pulse count can yield physical position information for various mechanisms that are being driven by a motor. Because position is directly related to pulse count, compensation for pulse anomalies, for example, by missing pulse detection, would allow for continued correct operation of the attached load when one or more commutator pulses are missing. The software can filter the incoming signal and determine that a periodic pulse pattern is present. If the expected pattern is not present, for example by predicting characteristics of an expected pulse, and comparing the pulse prediction with an pulse characteristic, a pseudo pulse can be generated by the missing pulse detection algorithm to take the place of the missing pulse for purposes of position compensation.

Figure 6:
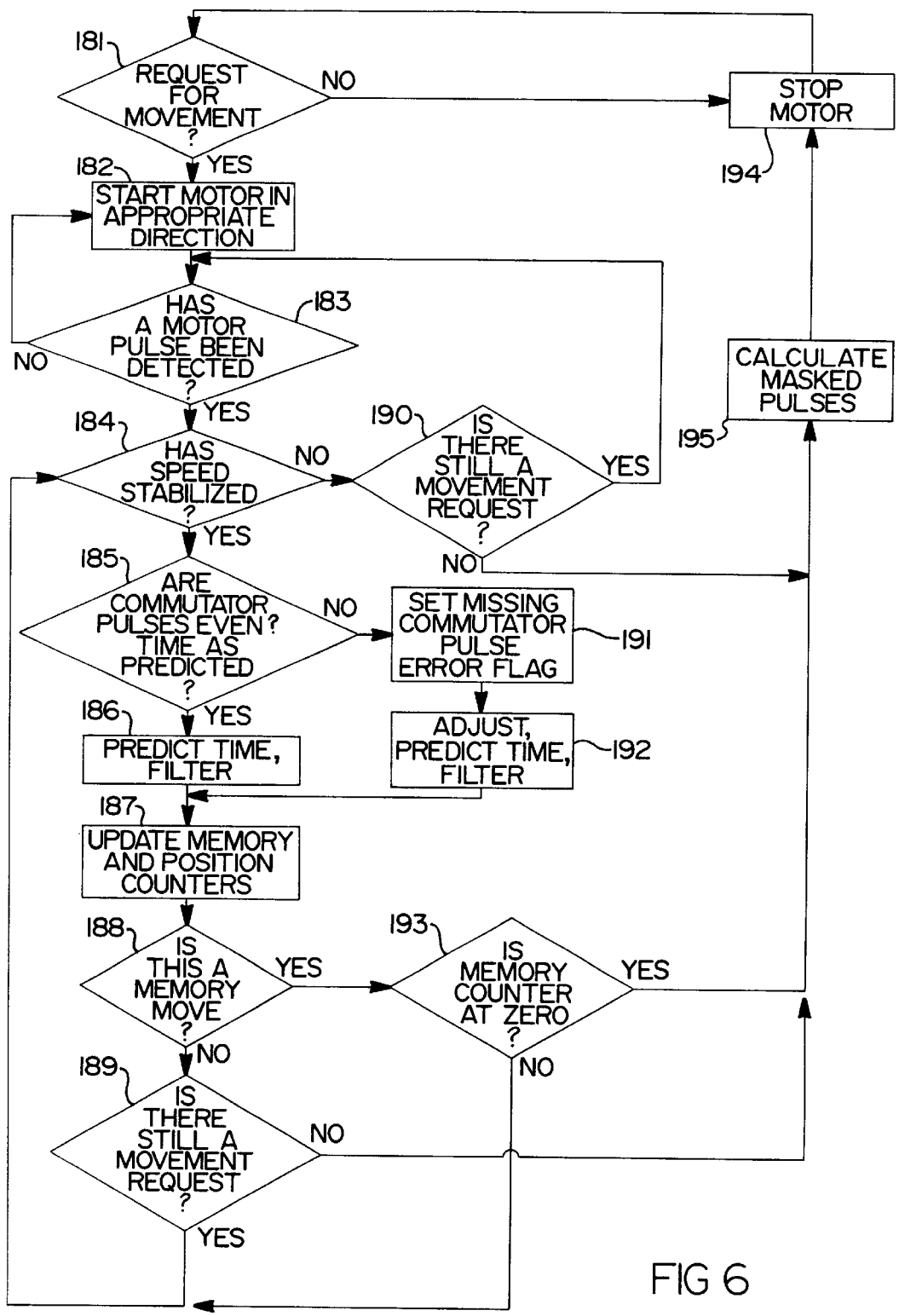
FIG. 6 is a flow chart diagram of a program algorithm employing a pulse count compensation control in accordance the present invention.

As shown at boxes 186 in FIG. 6, if the commutator pulses are even, and the pulse timing is as predicted, the algorithm predicts the time of the next commutation pulse and uses the prediction by comparison with incoming pulses to filter the new pulses. If the commutator pulses are not even, or the pulse timing is not as predicted, the algorithm sets an error flag and adjusts for the missing pulses, predicts a time for the next commutation pulse expected, and uses the prediction to filter the next pulse.

Another example of a compensation algorithm 55 for missing initial or start-up pulses is shown in FIG. 6. The software in the controller may calculate m ask ed pulses ((A/ID*X)/256+b) and adjust counters as appropriate. This compensates for pulses masked by inrush current at startup and electrical braking at shutdown. A/D is system voltage, X and b are constants in ROM defined for the system by characterizing each motor. Thus, upon any actuation of the manual switch for a motor, the controller applies electrical power to the motor until commutator pulses are detected. Once commutator pulses are detected, the calculation simulates the motor position that otherwise is calculated in response to motor current, time period of current application and motor speed, thus, further reducing the need for sensor components and robust wiring or communication requirements.

As the level of missed or extra pulses may reach a threshold, the operator of the system can be informed of the problem with the motor as with vehicle on board diagnostics, so that maintenance may be performed, while still allowing the system to operate normally. The software can determine that a commutator pulse is degenerating, that is to say, not similar to other commutator pulses, or going to fail soon. In this case, the operator of the system could be informed by a signal to an indicator that preventive maintenance should be performed before failure occurs. Alternatively, the missing pulse detection software could act upon pulses generated from other sensors, for example, hall effect sensors, variable reluctance sensors, and others that could be installed if desired.

In a system where load current is being monitored, an optional feature permits the control software to determine when an electrical fault, for example, a short circuit of the load occurs, to prevent battery drainage or current flow that damages the system. A rapid increase in load current beyond a given threshold is an indication that the output drive circuitry is shorted. Typically external circuitry will disconnect power from the shorted load or connection.

Preferably, the software can determine that a short circuit condition exists, and the controller reacts so that the output driver can be disabled and the operator notified of the fault condition. The software could also retry the output at a given rate, say once per second, to determine if the fault condition still exists. If the fault condition is corrected, the system will resume normal operation. Similar to short circuit operation, the software could determine stalled operation. If a motor load is energized and no commutation pulses are received (or other feedback), the software can determine that the mechanism is stalled. The software can again retry the function at a given rate, and the operator could be notified of a fault condition.

The microcontroller may incorporate communications software. Having communications with the adaptive seat module (ASM) as shown at 49, in FIG. 1, to an external controller will enable user inputs, such as switches, to be brought into the module through a standard communication input and the removal of for example, switch inputs 94, their respective switches and the individual wires from the various inputs. Communication capability will also enable the ASM to exchange diagnostic information with other controllers. High level communications, such as SAE J1850 or CAN, could be used to communicate from the ASM to another vehicle controller. Low level communications, standard serial protocol (SCI and others) could be used to transfer information and control signals to other microcontrollers located at the individual load. For example, a motor could have a small microcontroller incorporated into its circuitry along with passive or active filters and power drivers in integrated motor caps as discussed previously. The ASM central microcontroller 44 (master) would take instructions from the high level communications bus and then in turn, transmit specific instructions to individual loads such as the motors. The small microcontroller (slave) integrated with the motor would then interpret the instruction and act on it by providing drive signals to a load such as a motor.

The ASM differs from a simpler massage control module (MCM) in several important ways. In fact, the MCM is a subsystem of the ASM. Basically, the MCM, shown at FIG. 1 with the blocks 22 removed, contains the same microcontroller and power supply circuitry, but has only Switch inputs and power outputs specific to lumbar positioning and massage. While the same generic blocks exist in FIGS. 2a–d, the implemented circuit count is smaller because of the need for fewer motors (only two operated in one version of the module that operates up, down, in and out for support 32, in MCM, as shown in the schematic portion of seat mechanism 16, versus seven in the preferred version of seat controller for ASM). Specifically, MCM is implemented by use only of circuits in FIG. 2a (portions of block 94, 100, 102 & 104, all of blocks 96, 98 & 106) and FIG. 2b (portions of block 108, 110, 112, 114). Referring to the FIG. 1 representation, the adaptive seat system block diagram includes items deleted from ASM to result in MCM. The deleted features include switch inputs such as recline back 64, recline forward 65, horizontal back 67, horizontal forward 66, front vertical up 68, front vertical down 69 rear vertical up 70, rear vertical down, heated seat high 76, heated seat indicator 80, head rest up 78 and head rest down 80. In addition, an MCM module does not require power outputs such as front vertical motor up 118, front vertical motor down 120, recliner motor forward 122, recliner motor back 124, horizontal motor back 126, horizontal motor forward 128, heated seat +130, heated seat –132, head rest motor up 134, rear vertical motor up 138, and rear vertical motor down 140. However, the selection of features to be controlled by one module may be varied as desired to meet the goals assigned to the system. As also shown in FIG. 1, lumbar motor up output 142 and lumbar motor down output 146 for operating motor 32 as well as lumbar motor output 144 and lumbar motor in output 148 for motor 28 are employed to displace support 32 in the preferred embodiment.

Alternative to determining lumbar support position by direct measurement of some physically sensed variable is the option of empirically measuring the relative amounts of time, under ambient conditions of temperature, voltage, and lumbar load, to drive the lumbar support from either end of travel (EOT) limit to the present home position and from each end of travel (EOT) physical limit to the opposite as determined by lumbar drive motor stall current detection or end of travel limit Switches. Preferably, the control module 12 uses some signal such as current, time, temperature, voltage, motor pulses, movements or other inputs and an algorithm or look-up tables for determination of position and generation of automated commands for returning a support to home position at the finish of the displacement function.

Preferably, both the memory type module and the non-memory type may use the same module housing 52, printed circuit board, microcontroller 44, and algorithms in the software programs. Different components may populate the printed circuit for the memory type versus the non-memory type massage control module as previously identified without departing from the present invention. The memory type massage control module uses its microcontroller inputs and outputs, having tri-state capability, to poll both massage control module and external interface circuitry. Polling discerns the type of external interface Switching and electronics in a seat control or seat control module from different vendors and for different models and thus to determine which particular control algorithms are appropriate, for example as described below, and determines the biasing, to be applied to certain microcontroller outputs for correct operation. The module provides watchdog capability to trap and recover from any software or addressing problem which may prevent normal operation.

In the case of the control module which interfaces with a nonmemory type seat control with portions 22, the physical packaging and the printed circuit board may be identical, although the components populating the printed circuit board differ.

The control module 12 appears virtually nonexistent to the independent and priority functionality of an existing seat control system 42 that may be incorporated in a system 16. Thus, the massage control module is transparent to the higher priority of all functions of the existing seat control system 42. To accomplish this, a massage control module may intercept the true lumbar support position signal from a sensor or the motor pulse detector and provide a simulated virtual lumbar support position signal to the existing seat controller 42. By providing a virtual lumbar support sensor signal steadily representing a lumbar position to the seat controller, the massage control module can then move the lumbar support 32 without the seat controller of existing system 42 being aware of the true and changing lumbar support position. This prevents the seat controller from generating an error condition caused by movement of the lumbar support 32 in a system of known type modified by installation of a control system according to the present invention.

The MCM may also intercept other signals, such as both the UP and DOWN switch inputs from a lumbar switchpad which is either a special control panel or switch, or alternatively, a combination actuation of existing switch controls, receiving the motor drive outputs from the seat controller system 42, passing along simulated signals and driving loads consistent with functional requirements of both the seat controller of the system 42 and the massage control module. This gives dependent and lower priority control of the lumbar support 32 to the massage control module so that it can perform the massage function, although virtual priority and virtual independent control always remains with the seat controller of the seat system 42. This method of functional control modification is based upon the in-line modular massage control module intercepting real signals and/or power and transparently substituting simulated signals and/or power between the seat controller of the system 42 and external devices such as sensors, motors 18, and switches on switch pad 46. The case of the non-memory system 22 is simpler by virtue of not having to interface sensor signals to the seat control 16.

The position of the lumbar support 32 may also be intercepted directly and exclusively from a lumbar support position sensor by the massage control module as an analog signal via a SENSOR IN input terminal. This analog signal is replicated or functionally modified as described below at the massage control module to provide a signal at a SENSOR OUT output terminal that is a simulated virtual representation of the lumbar support position to the seat controller. This simulated virtual SENSOR OUT signal value is generated and maintained within specific required accuracy and precision by digital pulsing of a pushpull circuit, preferably using software algorithms and decision making processes within the microcontroller 44 of the massage control module 34. Using appropriate algorithms and closed loop feedback control, the microcontroller 44 is able to monitor and anticipate drift and changes in the simulated output signal from the MCM 34. Thus, the microcomputer output signal changes to produce the desired simulated signal output voltage to the controller of the existing system 42.

When the motor is driven CW (CCW), the lumbar support travel is upward (downward) and the lumbar support position sensor output voltage is also going upward (downward). The motor 24 is immediately turned off when end of travel is detected, and at this point only movement in the opposite direction is allowed. Once movement in the opposite direction is detected, the end of travel software flag is released and movement in either direction is allowed. This automatic stopping and reversing of the drive motor direction at ends of lumbar support travel during lumbar massage can be annoying to some, so an alternate hardware choice may be made with appropriate required changes in software algorithms such as the termination of current before end of travel as discussed earlier. Such alternate hardware can take the form of a crank gear with a crankshaft and pushrod mechanism to convert continuous motor operation into a reciprocating back-and-forth motion.

The reversal of direction during motor drive in either the CW or the CCW direction, hence the reversal of the lumbar support position sensor voltage from upward to downward or from downward to upward, flags the software within the microcontroller 44 that an end of travel limit has been reached.

The massage control module may be either in series, in parallel, or combinations thereof to intercept and simulate signals between the existing seat controller and external devices such as: BATTERY, COMMON, control Switches, position sensor, and motor. A portion 50 of terminals may be part of the coupling terminals, although it is preferably eliminated to simplify the housing when replaced with vehicle wiring harness adaptions.

With feedback monitoring and appropriate software algorithms, such as drift control protection, to control the switched pulsing of transistors Q10 and Q6, the MCM may maintain control of the output voltage over a range from COMMON to Vcc. The feedback voltage as read by the microcontroller 44 at input RA1 is compared with the desired output voltage, the difference affecting the number of fixed duration pulses necessary at either transistor Q10 to raise the output voltage or at transistor Q6 to lower the output voltage. The output voltage is read by the microcontroller 44 which then turns on either transistor Q10 or Q6 in a pulsing manner to respectively raise or lower the output voltage to the desired level. When the voltage at the output varies from the desired output voltage, the microcontroller 44 uses software algorithms to determine the length of time for the voltage change and how many pulses occurred to correct the voltage change. In anticipation of similar drift characteristics, the microcontroller 44 will then pulse either transistor Q10 or transistor Q6 to maintain the desired output voltage. This algorithm is adaptive and can be used for static and dynamic output voltages desired to obtain preferred rates for seat movement.

Figure 7:
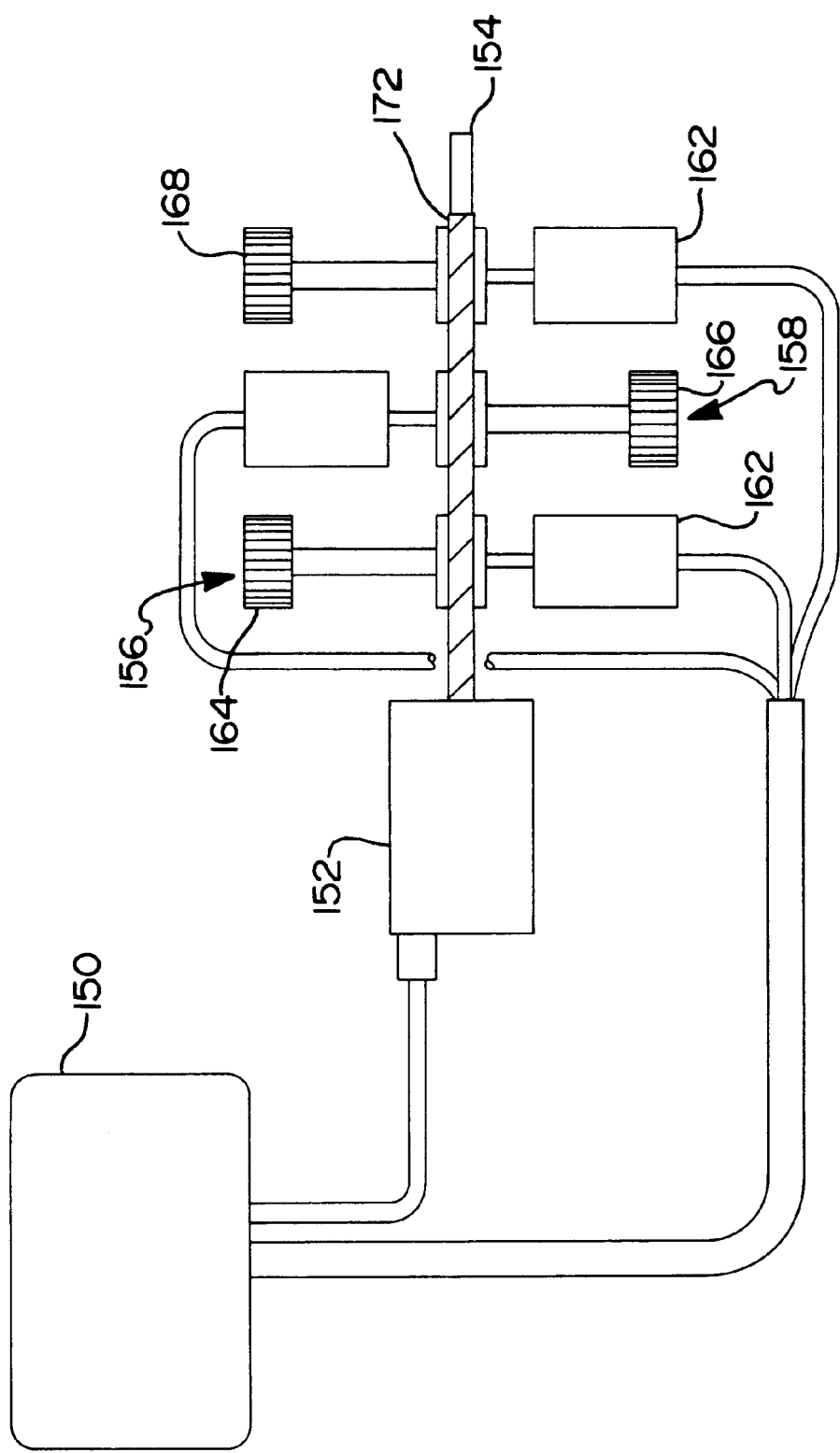
FIG. 7 is a diagrammatic view of a further modified seat control system simplified according to the present invention.
Figure 8:
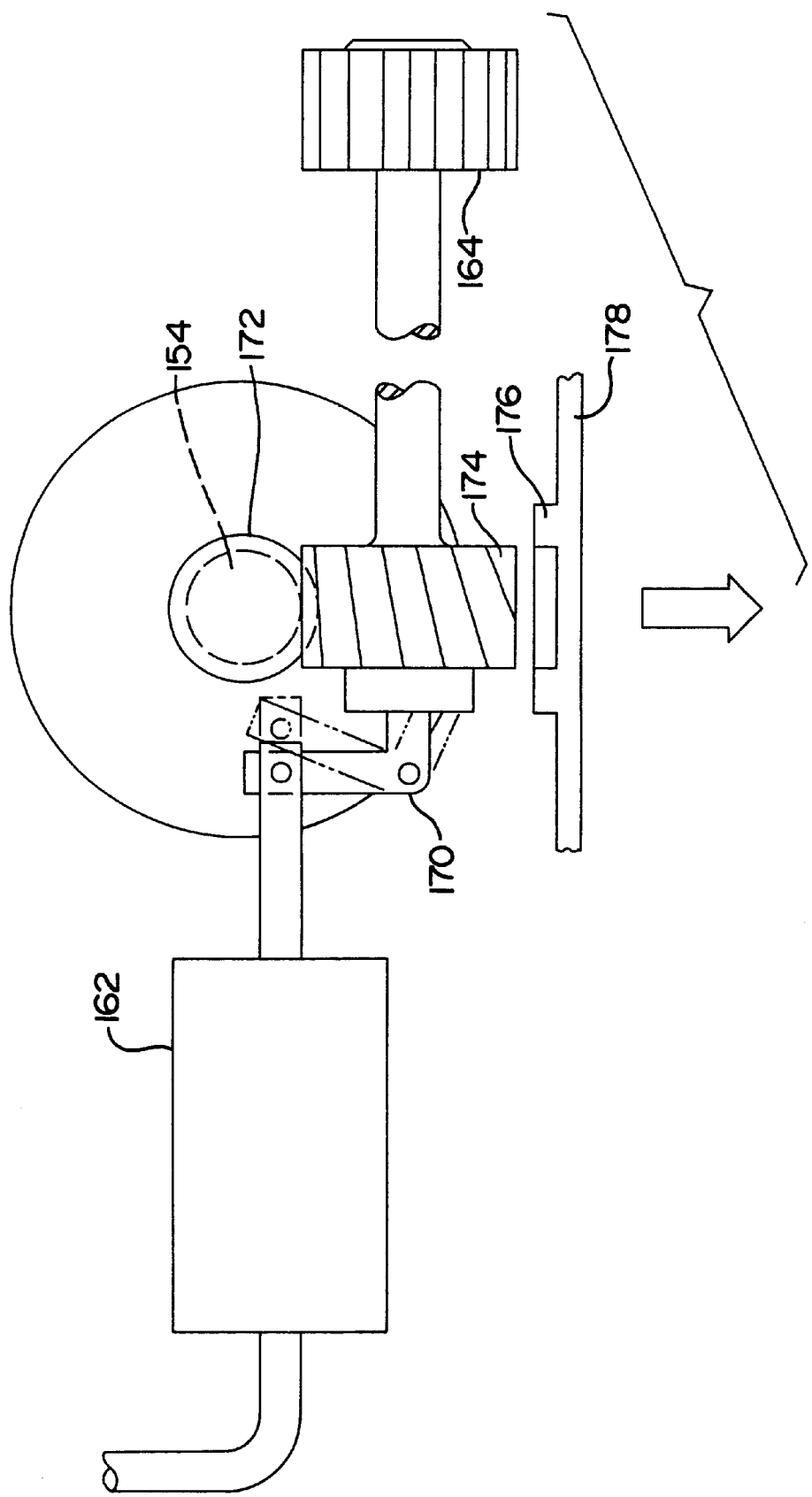
FIG. 8 is a side elevation view of the control shown in FIG. 7.

As shown in FIGS. 7 and 8, a modified control system includes an electronic control module 150 used to drive a motor 152. The motor shaft 154 is coupled to a plurality of selectively engageable mechanical transmissions 156, 158, and 160. Selection of each transmission being operated by the shaft 154 preferably includes a solenoid 162 in each of the transmissions 156, 158, and 160. As best shown in FIG. 8, the engagement mechanism operates in response to the solenoid 162 so that each disengaged solenoid 162 drops a mating worm drive gear 174 into a rib feature 176 in the transmission housing 178 to prevent movement when the solenoid 162 is not actuated. Each of the transmissions may be a power take-off for substantially different displacement mechanisms. In the preferred embodiment, transmission 156 controls seat front up/down displacement through a drive gear 164, transmission 158 controls seat rear up/down displacement through drive gear 166, and transmission 160 controls seat forward/reverse displacement through drive gear 168 Each drive gear is coupled for rotation with a separate worm gear 174 engaged with a worm shaft 172 carried on the motor shaft 154. Such a system substantially reduces the number of motors that must be employed in the seat control system and further simplifies a seat control assembly with displacers when constructed according to the present invention. Nevertheless, the electronic control module 110 incorporates the motor operations parameters such as the commutator pulse counters and the compensation features that enable the position of the seat element supports that are displaced to be accurately positioned as desired.

As a result, the present invention improves the accuracy and precision of displacer control by relying upon motor movement. Since detection of movement is physically simplified where external sensors can be avoided, the preferred embodiment for a rotary motor employs a commutator pulse detector and a compensator for monitoring operating parameters that may be used to simulate pulses when movement detection is obscured. In a linear motor example, the pulses accounted for control may be the driving pulses delivered to the motor. Pulses may also be monitored by responses from detecting non-energized windings. Regardless of the mannor of detection, a position limiter controls power delivery to the motor for accurate positioning of a displacer in response to microprocessing evaluation and interaction of multiple operating parameters in a compensator. As a result, previously unreliable detection systems may be used in a substantially less complex and less costly displacement mechanism having multiple functions and multiple memory configurations of the displacers.

Having thus described embodiments of the present invention, many modifications will become apparent to those of ordinary skill in the art to which it pertains without departing from the scope and spirit of the present invention as defined in the appended claims.

What is claimed is:

1. A position controller for at least one displacer driven by at least one motor with a displaceable shaft, the controller comprising:
   a control module for selectively delivering electrical power to the motor and a monitor for the delivery of electrical power to the motor;
   a sensor means for detecting displacement of the motor shaft; and a position limiter controlling delivery of power to the motor in response to said sensor and said monitor, said limiter including compensation for relative displacement between the shaft and the displacer, and a compensator for falsely sensed or unsensed displacement of said shaft preventing response to a falsely sensed displacement or adding a response to a missed displacement in dependence upon said monitor for delivery of electrical power.

2. The invention as described in claim 1 wherein the motor has a rotary shaft with a commutator and said sensor comprises an interface circuit for generating pulses in response to rotation of the commutator.

3. The invention as described in claim 2 wherein said position limiter includes said compensator for unsensed displacement, said compensator determining the absence of a pulse expected during rotation by monitoring motor current and detecting said pulses from said interface circuit, and generating an adaptive feedback pulse in response to the absence.

4. The invention as described in claim 2 wherein said position limiter includes a predictor that determines an expected pulse position as a function of rotating shaft speed, time and pulse count.

5. The invention as described in claim 3 wherein said position limiter adapts the controller to terminate power to the motor prior to an end of travel position of said at least one displacer in response to said compensator.

6. A seat controller for managing displacement of at least one component of a seat mechanism by operation of a motor, the control comprising:
 a motor monitor sensing commutator rotation pulses of said motor;
 a motor operation monitor sensing at least one motor operating parameter for the motor actuation; and
 a compensator for adjusting the displacement in response to said rotation pulses and said at least one motor operating parameter.

7. The invention as described in claim 6 wherein said compensator comprises a commutator current and/or voltage pulse counter and a motor current detector.

8. A method for simplifying control of at least one motor and determining the position of a displacer moved by said at least one motor, the method comprising:
 generating a commutator pulse for each movement of said motor over a predetermined increment of motor operation parameter;
 determining a location of the displacer by adaptively accounting for each said commutator pulse; and
 compensating for undetectable pulses and for motor operation parameter variations by indicating position of the displacer and adjusting the indicated position of said displacer in response to said accounting.

9. The invention as described in claim 8 wherein said predetermined increment of motor operation parameter comprises a sensor response to at least one moving motor part, timing a duration from an actuation command, detecting a motor current and detecting a motor voltage.

10. The invention as described in claim 9 wherein said motor includes a rotary shaft and a commutator and said moving a motor part is detected by sensing commutator pulses.

11. The invention as described in claim 9 wherein said moving a motor part is detected by sensing a shaft displacement.

12. An apparatus for controlling movement of a displacer comprising:
 at least one motor;
 at least one coupling for moving the displacer in response to operation of said motor;
 at least one sensor providing signals in response to a parameter associated with at least one of said motor, said coupler and the displacer; and
 a controller with adaptive processing for monitoring and controlling said parameter monitoring an operating control for said motor, said adaptive processor including a compensator supplied with simulated limits of said parameter, a comparing for comparing said simulated limits of said parameter with said sensed parameter, and a control signal adjustor determining motor position in response to said comparison and in dependence upon said operating control.

13. The invention as described in claim 12 wherein said simulated limits and said parameter are electrical noise parameters.

14. The invention as described in claim 12 wherein said simulated limits and said parameter are electrical power to said motor including energization errors at startup.

15. The invention as described in claim 12 wherein said variable limits and said parameter are electrical power to said motor including de-energization errors.

16. The invention as described in claim 12 wherein the motor has brushes and a mechanical commutator for selectively energizing and commutating the electrical currents to motor coil windings, and wherein said parameter comprises commutating pulses.

17. The invention as described in claim 12 wherein the motor is a brushless type motor and wherein said parameter comprises energy applied to motor windings.

18. The invention as described in claim 17 wherein said parameter sensor includes an electronic interface circuit for detecting current in said windings.

19. The invention as described in claim 18 wherein said parameter sensor includes a band pass filter to select a predetermined range of commutation pulse frequencies.

20. The invention as described in claim 18 wherein said parameter sensor includes a detector for motor current in unenergized windings.

21. The invention as described in claim 18 wherein said control signal adjustor includes a simulator for selectively energizing motor windings in response to said parameter sensor.

22. The invention as described in claim 12 wherein said parameter sensor is a displacement sensor.

23. The invention as described in claim 12 wherein said motor is a linear motor.

24. The invention as described in claim 12 wherein said controller and said parameter sensor are integrally coupled with the motor housing.

25. The invention as described in claim 12 wherein said signals comprise a first time derivative of said parameter.

26. The invention as described in claim 12 wherein said signals comprise a second time derivative of said parameter.

27. The invention as described in claim 12 wherein said displacer is a support for an automotive component.

28. The invention as described in claim 12 wherein said controller includes a sensor for determining physical obstruction to movement of the displacer.

29. The invention as described in claim 12 wherein said controller includes automatic memory positioning.

30. The invention as described in claim 12 and further comprising a communicator.

31. A position controller for at least one displacer driven by at least one motor with a displaceable shaft, the controller comprising:
 a control module for selectively delivering electrical power to the motor and a monitor for the delivery of electrical power to the motor;
 a sensor means for detecting displacement of the motor shaft; and a position limiter controlling delivery of power to the motor in response to said sensor and said monitor, said limiter including compensation for relative displacement between the shaft and the displacer, and a compensator for falsely sensed or unsensed displacement of said shaft preventing response to a falsely sensed displacement or adding a response to a missed displacement in depending upon said monitor for delivery of electrical power;

wherein the motor has a rotary shaft with a commutator and said sensor comprises an interface circuit for generating pulses in response to rotation of the commutator;

said position limiter includes said compensator for unsensed displacement, said compensator determining the absence of a pulse expected during rotation by monitoring motor current and detecting said pulses from said interface circuit, and generating an adaptive feedback pulse in response to the absence; and wherein said position limiter includes a predictor that determines an expected pulse position as a function of rotating shaft speed, time and pulse count.

32. A position controller for at least one displacer driven by at least one motor with a displaceable shaft, the controller comprising:

a control module for selectively delivering electrical power to the motor and a monitor for the delivery of electrical power to the motor;

a sensor means for detecting displacement of the motor shaft; and a position limiter controlling delivery of power to the motor in response to said sensor and said monitor, said limiter including compensation for relative displacement between the shaft and the displacer, and a compensator for falsely sensed or unsensed displacement of said shaft preventing response to a falsely sensed displacement or adding a response to a missed displacement in depending upon said monitor for delivery of electrical power;

wherein the motor has a rotary shaft with a commutator and said sensor comprises an interface circuit for generating pulses in response to rotation of the commutator;

said position limiter includes said compensator for unsensed displacement, said compensator determining the absence of a pulse expected during rotation by monitoring motor current and detecting said pulses from said interface circuit, and generating an adaptive feedback pulse in response to the absence; and wherein said position limiter adapts the controller to terminate power to the motor prior to an end of travel position of said at least one displacer in response to said compensator.

33. An apparatus for controlling movement of a displacer comprising:

at least one motor;

at least one coupling for moving the displacer in response to operation of said motor;

at least one sensor providing signals in response to a parameter associated with at least one of said motor, said coupler and the displacer; and a controller with adaptive processing for monitoring and controlling said parameter monitoring an operating control for said motor, said adaptive processor including a compensator supplied with simulated limits of said parameter, a comparing for comparing said simulated limits of said parameter with said sensed parameter, and a control signal adjustor determining motor position in response to said comparison and in dependence upon said operating control;

wherein said simulated limits and said parameter are electrical power to said motor including energization errors at startup.

34. An apparatus for controlling movement of a displacer comprising:

at least one motor;

at least one coupling for moving the displacer in response to operation of said motor;

at least one sensor providing signals in response to a parameter associated with at least one of said motor, said coupler and the displacer; and a controller with adaptive processing for monitoring and controlling said parameter monitoring an operating control for said motor, said adaptive processor including a compensator supplied with simulated limits of said parameter, a comparing for comparing said simulated limits of said parameter with said sensed parameter, and a control signal adjustor determining motor position in response to said comparison and in dependence upon said operating control;

wherein said variable limits and said parameter are electrical power to said motor including de-energization errors.

35. An apparatus for controlling movement of a displacer comprising:

at least one motor;

at least one coupling for moving the displacer in response to operation of said motor;

at least one sensor providing signals in response to a parameter associated with at least one of said motor, said coupler and the displacer; and a controller with adaptive processing for monitoring and controlling said parameter monitoring an operating control for said motor, said adaptive processor including a compensator supplied with simulated limits of said parameter, a comparing for comparing said simulated limits of said parameter with said sensed parameter, and a control signal adjustor determining motor position in response to said comparison and in dependence upon said operating control;

wherein said signals comprise a first time derivative of said parameter.

36. An apparatus for controlling movement of a displacer comprising:

at least one motor;

at least one coupling for moving the displacer in response to operation of said motor;

at least one sensor providing signals in response to a parameter associated with at least one of said motor, said coupler and the displacer; and a controller with adaptive processing for monitoring and controlling said parameter monitoring an operating control for said motor, said adaptive processor including a compensator supplied with simulated limits of said parameter, a comparing for comparing said simulated limits of said parameter with said sensed parameter, and a control signal adjustor determining motor position in response to said comparison and in dependence upon said operating control;

wherein said signals comprise a second time derivative of said parameter.

* * * * *

UNITED STATES PATENT AND TRADEMARK OFFICE
CERTIFICATE OF CORRECTION

| | | |
|---|---|---|
| PATENT NO. | : 6,243,635 B1 | |
| DATED | : June 5, 2001 | |
| INVENTOR(S) | : Jeffrey Swan et al. | |

It is certified that error appears in the above-identified patent and that said Letters Patent is hereby corrected as shown below:

Column 16, claim 12,
Line 8, delete "comparing" (first instance) and substitute therefor -- comparor --.

Column 17, claim 33,
Line 65, delete "comparing" (first instance) and substitute therefor -- comparor --.

Column 18, claim 34,
Line 19, delete "comparing" (first instance) and substitute therefor -- comparor --.

Column 18, claim 35,
Line 39, delete "comparing" (first instance) and substitute therefor -- comparor --.

Column 18, claim 36,
Line 59, delete "comparing" (first instance) and substitute therefor -- comparor --.

Signed and Sealed this

Nineteenth Day of February, 2002

*Attest:*

JAMES E. ROGAN
*Attesting Officer*   *Director of the United States Patent and Trademark Office*